United States Patent
Lin (10) Patent No.: US 11,668,742 B2
(45) Date of Patent: Jun. 6, 2023

(54) INJECTION DEVICE, MICRO LIGHT EMITTING DIODE INSPECTION AND REPAIRING EQUIPMENT AND INSPECTION AND REPAIRING METHOD

(71) Applicant: PlayNitride Display Co., Ltd., MiaoLi County (TW)

(72) Inventor: Cheng-Cian Lin, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 617 days.

(21) Appl. No.: 16/726,088

(22) Filed: Dec. 23, 2019

(65) Prior Publication Data

US 2021/0048473 A1 Feb. 18, 2021

(30) Foreign Application Priority Data

Aug. 14, 2019 (TW) .................................. 108128874

(51) Int. Cl.
*G01R 31/26* (2020.01)
*H01L 21/683* (2006.01)
(Continued)

(52) U.S. Cl.
CPC ...... *G01R 31/2635* (2013.01); *H01L 21/6838* (2013.01); *H01L 22/00* (2013.01); *H01L 33/0095* (2013.01); *H01L 22/12* (2013.01)

(58) Field of Classification Search
CPC ...... H01L 22/12; H01L 22/00; G01R 31/2635
See application file for complete search history.

(56) References Cited

U.S. PATENT DOCUMENTS

2010/0166290 A1* 7/2010 Wang ............... G01N 21/95607
382/149
2011/0220268 A1* 9/2011 Nishio .................... B32B 27/36
428/354
(Continued)

FOREIGN PATENT DOCUMENTS

CN 206554799 10/2017
CN 108074805 5/2018
(Continued)

OTHER PUBLICATIONS

"Notice of Allowance of China Counterpart Application," dated Aug. 9, 2021, p. 1-p. 4.
(Continued)

*Primary Examiner* — Jae Lee
(74) *Attorney, Agent, or Firm* — JCIPRNET (57) ABSTRACT

Micro light emitting diode inspection and repairing equipment including a carrying stage, an optical inspection module and an injection device is provided. The optical inspection module is arranged corresponding to the carrying stage to capture image information and obtain a position coordinate from the image information. The injection device is adapted to move to a target position of the carrying stage according to the position coordinate. The injection device includes a tube and a nozzle. The tube includes a first portion and a second portion connected to the first portion. The extending direction of the first portion is different from the extending direction of the second portion. A fluid blows to the target position after passing through the tube and the nozzle. An inspection and repairing method adopting the micro light emitting diode inspection and repairing equipment is also provided.

7 Claims, 7 Drawing Sheets

(51) Int. Cl.
*H01L 33/00* (2010.01)
*H01L 21/66* (2006.01)

(56) References Cited

U.S. PATENT DOCUMENTS

2014/0292908 A1   10/2014   Watanabe et al.
2016/0247705 A1*   8/2016   Sumitani .......... H01L 21/67253

FOREIGN PATENT DOCUMENTS

| | | |
|---|---|---|
| CN | 108172590 | 6/2018 |
| CN | 109047186 | 12/2018 |
| JP | 2013154316 | 8/2013 |
| JP | 2017122608 | 7/2017 |
| TW | M385791 | 8/2010 |
| TW | 201425912 | 7/2014 |
| TW | M490658 | 11/2014 |
| TW | M552102 | 11/2017 |
| WO | 2006078025 | 7/2006 |

OTHER PUBLICATIONS

"Office Action of Taiwan Counterpart Application", dated Mar. 2, 2020, p. 1-p. 12.
"Office Action of China Counterpart Application", dated Feb. 1, 2021, p. 1-p. 9.

* cited by examiner

INJECTION DEVICE, MICRO LIGHT EMITTING DIODE INSPECTION AND REPAIRING EQUIPMENT AND INSPECTION AND REPAIRING METHOD

CROSS-REFERENCE TO RELATED APPLICATION

This application claims the priority benefit of Taiwan application serial no. 108128874, filed on Aug. 14, 2019. The entirety of the above-mentioned patent application is hereby incorporated by reference herein and made a part of this specification.

BACKGROUND

1. Technical Field

The disclosure relates to a micro light emitting diode inspection and repairing technology, and in particular, to an injection device as well as micro light emitting diode inspection and repairing equipment and a micro light emitting diode inspection and repairing method.

2. Description of Related Art

In recent years, in the case that the manufacturing cost of an organic light emitting diode (OLED) display panel is relatively high, and the lifetime and the reliability of the OLED display panel cannot compete with an existing mainstream display, a micro LED display gradually attracts various scientific and technical manufacturers to make an investment. In addition to the advantages of low energy consumption and long material service life, the micro LED display also has excellent optical performance, such as high color saturation, high response speed and high contrast.

On the other hand, in order to achieve lower production cost and larger product design margin, a manufacturing technique of the micro LED display adopts a chip transfer mode, that is, a mass transfer technique, to directly transfer fabricated micro LED chips to a driving circuit backplane. Specifically, a chip manufacturer needs to firstly make (or place) micro LED chips on a temporary substrate, and then to transfer the micro LED chips stored on the temporary substrate to driving circuit boards of different products according to different application requirements.

However, in the processes of producing the micro LED chips, it is inevitable to have a certain number of abnormal micro LED chips. Therefore, how to remove these abnormal micro LED chips to improve the yield of end products has become an important issue for related manufacturers.

SUMMARY

The disclosure provides an injection device with a high repair rate.

The disclosure provides micro light emitting diode inspection and repairing equipment with high repairing yield.

The disclosure provides a micro light emitting diode inspection and repairing method with a high repair rate.

The micro light emitting diode inspection and repairing equipment of the disclosure includes: a carrying stage, an optical inspection module and an injection device. The optical inspection module is arranged corresponding to the carrying stage so as to capture image information and obtain a position coordinate from the image information. The injection device is adapted to move to a target position of the carrying stage according to the position coordinate. The injection device includes a tube and a nozzle. The tube includes a first portion and a second portion connected to the first portion. The extending direction of the first portion is different from the extending direction of the second portion, and an extension axis of the second portion passes through the target position. The nozzle is connected to the second portion of the tube. A fluid blows to the target position after passing through the tube and the nozzle.

In an embodiment of the disclosure, the micro light emitting diode inspection and repairing equipment further includes a suction device arranged on the carrying stage and adapted to move to the target position according to the position coordinate.

In an embodiment of the disclosure, the optical inspection module of the micro light emitting diode inspection and repairing equipment includes an image capturing element and an image processing device. The image capturing element is configured to capture image information. The image processing device is coupled to the image capturing element and configured to analyze the image information to obtain the position coordinate.

In an embodiment of the disclosure, the micro light emitting diode inspection and repairing equipment further includes at least one moving mechanism, and the image capturing element and the injection device are arranged on the moving mechanism. The moving mechanism is adapted to drive the image capturing element and the injection device to move relative to the carrying stage.

In an embodiment of the disclosure, the image capturing element of the micro light emitting diode inspection and repairing equipment includes a lens module and an image sensor. The image sensor is coupled to the image processing device. The lens module is located between the carrying stage and the image sensor.

In an embodiment of the disclosure, the optical inspection module of the micro light emitting diode inspection and repairing equipment includes a thickness detector configured to measure height information of the target position of the carrying stage.

In an embodiment of the disclosure, the nozzle and the tube of the micro light emitting diode inspection and repairing equipment are integrally formed.

A micro light emitting diode inspection and repairing method of the disclosure includes: providing micro light emitting diode inspection and repairing equipment, placing an object under test on the carrying stage of the micro light emitting diode inspection and repairing equipment, performing an optical inspection on multiple micro light emitting diodes on the object under test using an optical inspection module to verify whether the object under test has at least one defect, acquiring a position coordinate of the defect by using the optical inspection module after the defect is verified, and removing the defect. The micro light emitting diode inspection and repairing equipment includes a carrying stage, an optical inspection module and an injection device. The optical inspection module is arranged corresponding to the carrying stage to capture image information and obtain the position coordinate from the image information. The injection device includes a tube and a nozzle connected to an end of the tube. The tube includes a first portion and a second portion connected to first portion, and the extending direction of the first portion is different from the extending direction of the second portion. The object under test has a plurality of micro light emitting diodes. The injection device moves to the target position of the carrying stage corresponding to the position coordinate of the defect, and an extension axis of the second portion passes through the target position so that a fluid flows to the defect after passing through the tube and the nozzle to remove the defect from the object under test.

In an embodiment of the disclosure, the step of removing the at least one defect in the micro light emitting diode inspection and repairing method further includes: collecting the at least one defect removed from the object under test by a suction device.

In an embodiment of the disclosure, the micro light emitting diode inspection and repairing method further includes: performing another optical inspection on the object under test after the removal of the at least one defect.

In an embodiment of the disclosure, according to the micro light emitting diode inspection and repairing method, an angle is included between the extension axis of the second portion and a normal direction of a top surface of the defect, and the angle is between 10 degrees and 90 degrees.

In an embodiment of the disclosure, according to the micro light emitting diode inspection and repairing method, the extension axis of the second portion is perpendicular to the top surface of the defect and does not pass through a symmetrical axis of the defect.

The injection device of the disclosure is adapted to remove a micro element. The injection device includes a tube and a nozzle. The tube includes a first portion and a second portion connected to the first portion. The extending direction of the first portion is different from the extending direction of the second portion. The nozzle is connected to an end of the tube. A fluid is injected after passing through the tube and the nozzle.

In an embodiment of the disclosure, the aperture diameter of the nozzle of the injection device is less than 50 μm.

In an embodiment of the disclosure, the nozzle and the tube of the injection device are integrally formed.

Based on the above, in the micro light emitting diode inspection and repairing equipment and method according to an embodiment of the disclosure, the optical inspection of the object under test is performed by utilizing the optical inspection module to obtain the position coordinate of the defect, which helps to ensure a positioning relationship between the injection device and the defect, thereby improving the removal accuracy of the defect. On the other hand, the extension axis of the second portion of the tube passes through the defect so that the fluid passing through the nozzle can efficiently blow to the defect to remove the defect from the substrate of the object under test. In this way, it helps to improve the overall yield of a post process.

In order to make the aforementioned and other objectives and advantages of the disclosure comprehensible, embodiments accompanied with figures are described in detail below.

DESCRIPTION OF THE EMBODIMENTS

Reference will now be made in detail to the present embodiments of the disclosure, examples of which are illustrated in the accompanying drawings. Wherever possible, the same reference numbers are used in the drawings and the description to refer to the same or like parts.

Figure 1:
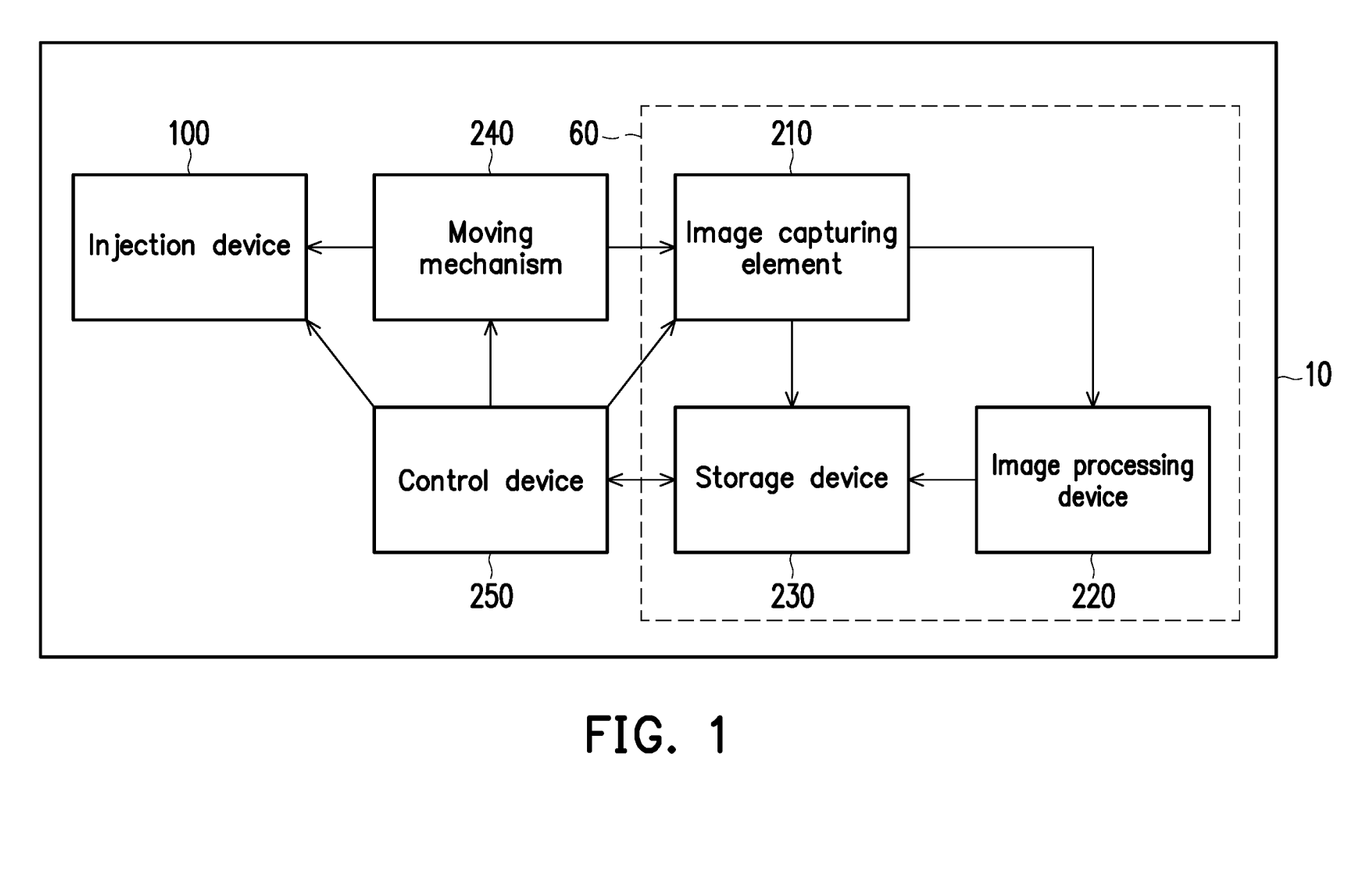
FIG. 1 is a block diagram of micro light emitting diode inspection and repairing equipment according to an embodiment of the disclosure.
Figure 2:
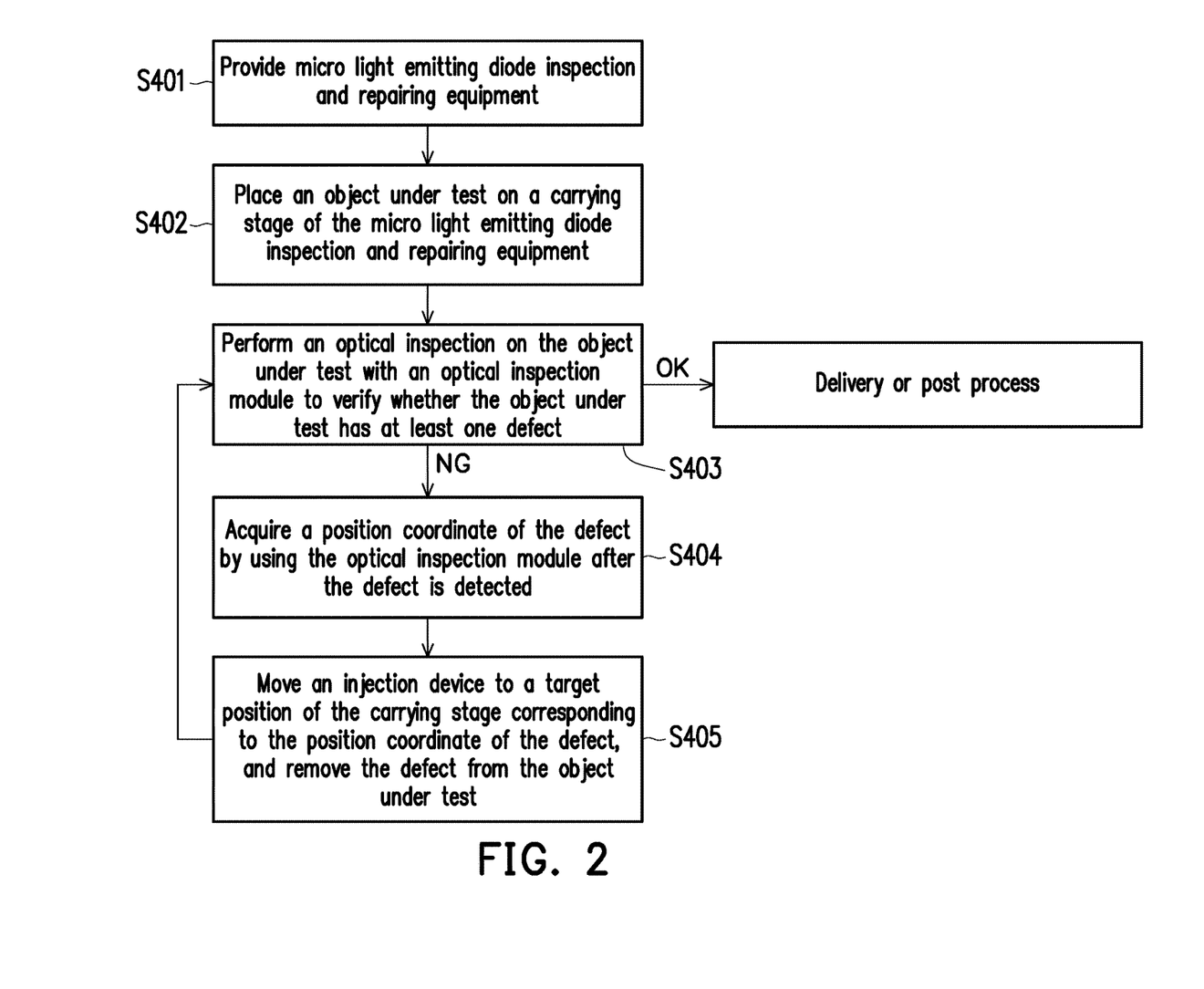
FIG. 2 is a flowchart of a micro light emitting diode inspection and repairing method according to an embodiment of the disclosure.

FIG. 1 is a block diagram of micro light emitting diode inspection and repairing equipment according to an embodiment of the disclosure. FIG. 2 is a flowchart of a micro light emitting diode inspection and repairing method according to an embodiment of the disclosure. FIG. 3A to FIG. 3D are diagrams of a micro light emitting diode inspection and repairing flow according to an embodiment of the disclosure. FIG. 4A and FIG. 4B are diagrams of an injection device in two operation states according to an embodiment of the disclosure. Specifically, for clear presentation and explanation, FIG. 3A to FIG. 3D omit an image processing device 220 and a storage device 230 of FIG. 1, FIG. 3A and FIG. 3B omit a suction device 70 of FIG. 3C, FIG. 3B to FIG. 3D omit a lens module 211 and an image sensor 212 of FIG. 3A, and FIG. 4A and FIG. 4B omit a carrying stage 50, a carrier 101, an image capturing element 210 and a control device 250 of FIG. 3C.

Figure 3A:
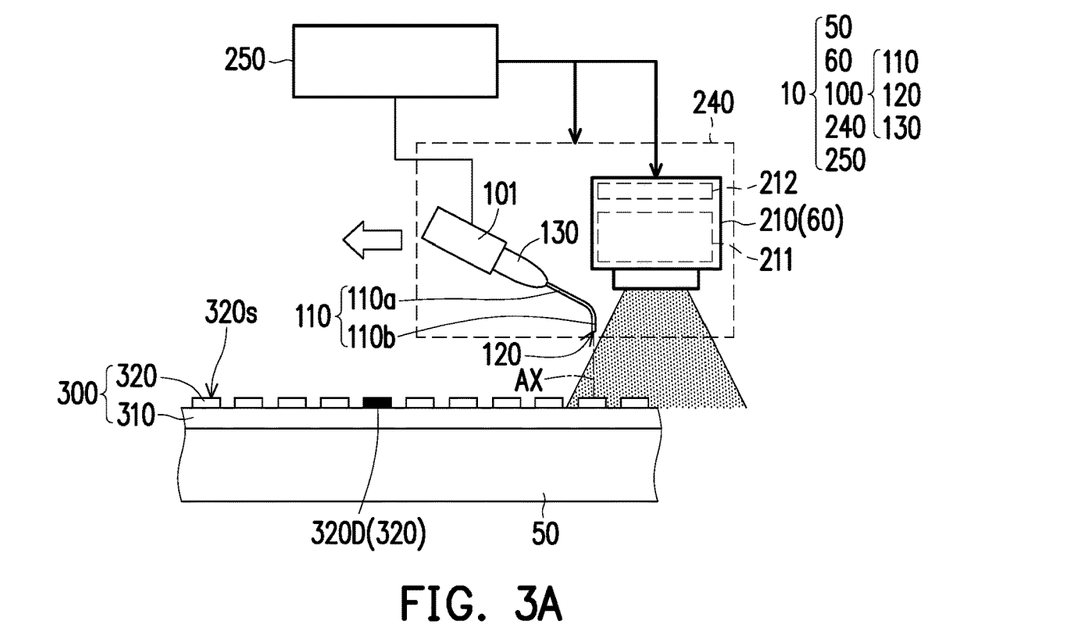
FIG. 3A to FIG. 3D are diagrams of a micro light emitting diode inspection and repairing flow according to an embodiment of the disclosure.
Figure 4A:
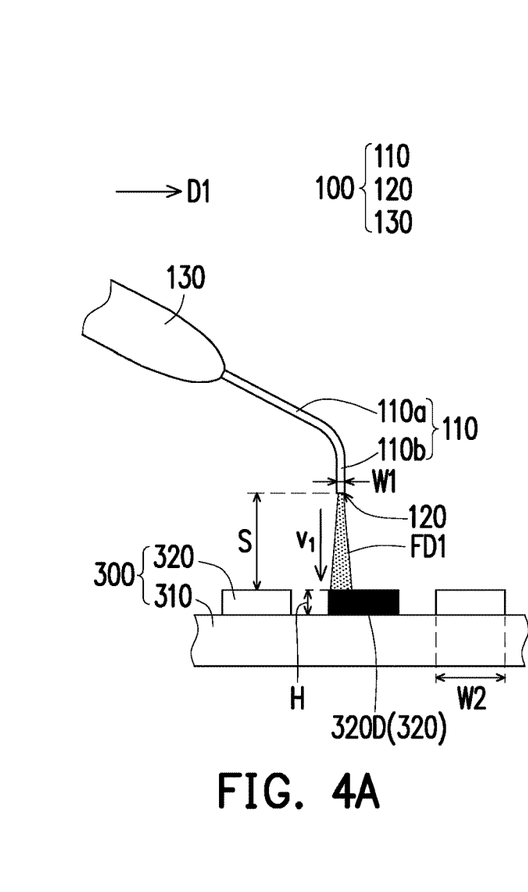
FIG. 4A and FIG. 4B are diagrams of an injection device in two operation states according to an embodiment of the disclosure.
Figure 4B:
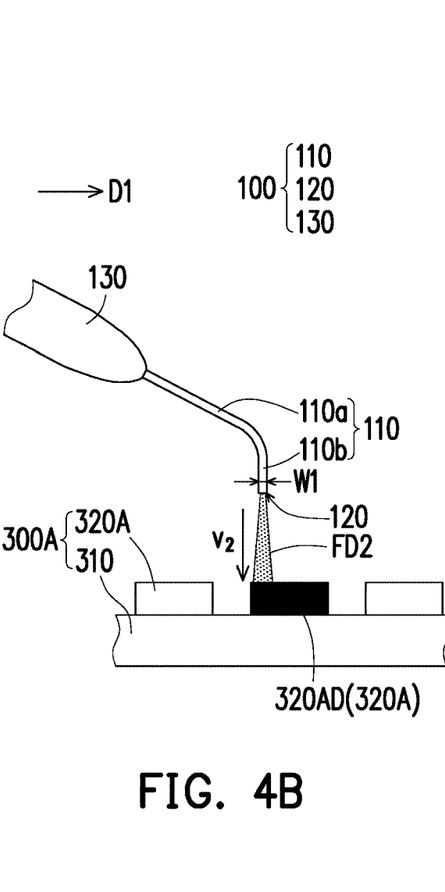

Referring to FIG. 1 and FIG. 3A, the micro light emitting diode inspection and repairing equipment 10 includes a carrying stage 50 and an optical inspection module 60. An object under test 300 is placed on the carrying stage 50. The optical inspection module 60 is arranged on the carrying stage 50, and the object under test 300 is arranged between the optical inspection module 60 and the carrying stage 50. In the present embodiment, the object under test 300 is, for example, a micro LED wafer, which includes a substrate 310 and a plurality of micro elements 320, and these micro elements 320 are arranged on the substrate 310. For example, the micro element 320 may be a micro light emitting diode (Micro LED). It should be understood that the embodiments of the disclosure are limited thereto. Some embodiments may also be applied to other micro elements, like micro IC, micro transistor unit and so on.

Following the above, the optical inspection module 60 is configured to capture image information about the object under test 300 and obtain a position coordinate of a defect 320D therefrom. In the present embodiment, the defect 320D may be one of the plurality of micro elements 320 which cannot be enabled or has a surface defect, but the disclosure is not limited thereto. In other embodiments, the defect 320D may also be a particle or dust that come from environment. It should be noted that the defect 320D in the present embodiment is illustrated by taking the quantity of one as an example, and does not mean that the disclosure is limited by the content of the schematic disclosure. According to other embodiments, there may be multiple defects 320D.

In the present embodiment, the optical inspection module 60 includes an image capturing element 210 and an image processing device 220. The image capturing element 210 is configured to capture the image information about the object under test. For example, the image capturing element 210 may include a lens module 211 and an image sensor 212, and the lens module 211 is located between the carrying stage 50 and the image sensor 212. The image sensor 212, for example, includes a charge coupled device (CCD) or a complementary metal-oxide semiconductor (CMOS) element. The image processing device 220 is coupled to the image sensor 212 of the image capturing element 210, and configured to analyze the image information to obtain the position coordinate of the defect 320. In the present embodiment, the optical inspection module 60 may also include a storage device 320 configured to store image information photographed by the image capturing element 210 or analysis results (for example, the opposition coordinate of the defect 320D) of the above image information made by the image processing device 220.

Figure 3B:
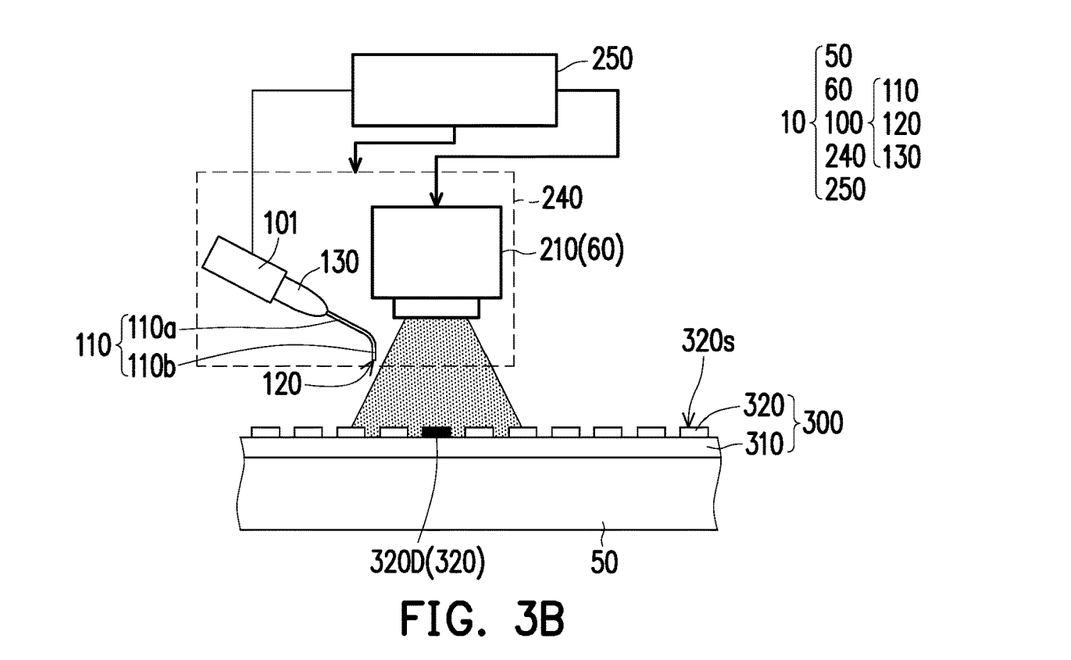
Figure 3C:
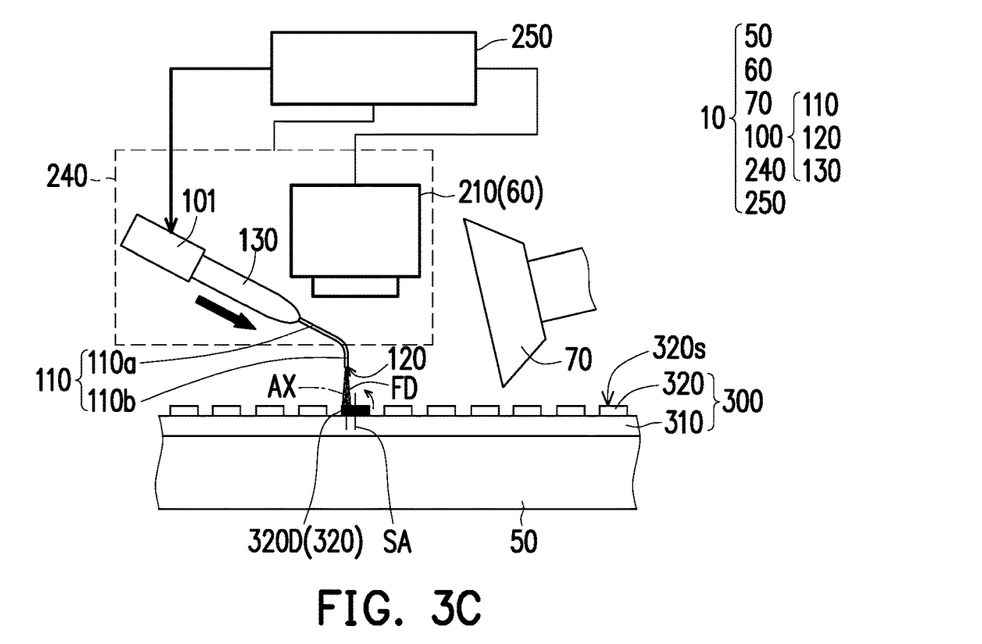
Figure 3D:
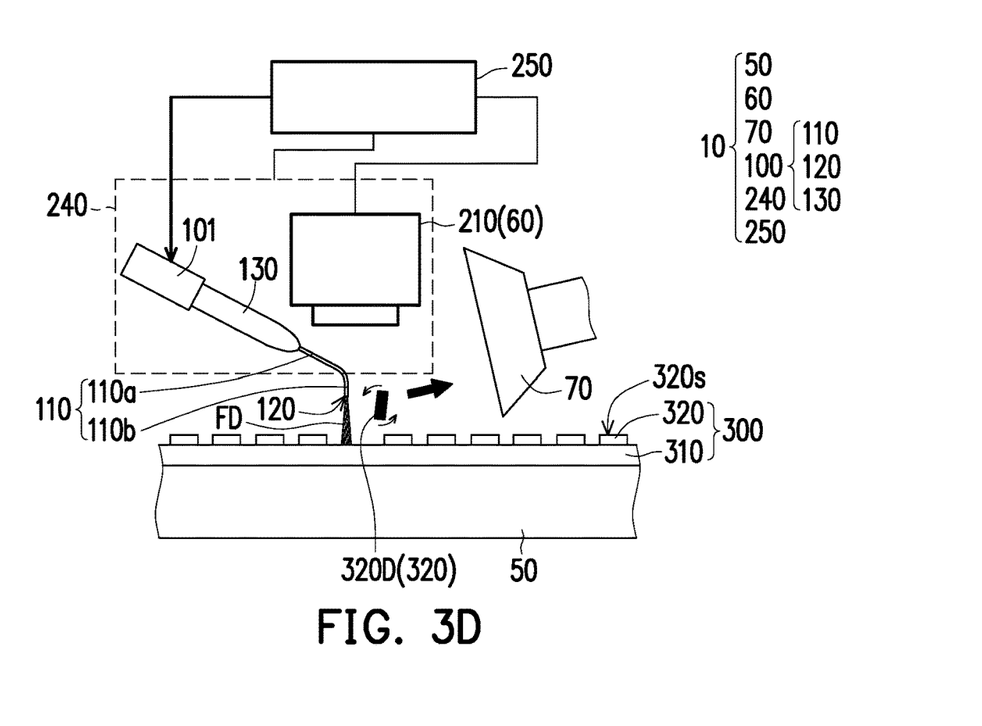

In order to remove the defect 320D from the object under test 300, the micro light emitting diode inspection and repairing equipment 10 is also provided with an injection device 100, and the object under test 300 is arranged between the injection device 100 and the carrying stage 50. Particularly, the micro light emitting diode inspection and repairing equipment 10 injects a fluid FD through the injection device 100, and the fluid FD blows to the defect 320D to remove the defect 320D from the object under test 300 (as shown in FIG. 3C and FIG. 3D). In the present embodiment, in order to verify the removal condition of the defect 320D through the image capturing element 210 in real time, the image capturing element 210 may be moved together with the injection device 100, but the disclosure is not limited thereto. In other embodiments, the injection device 100 and the image capturing element 210 may also be individually actuated.

Further, the injection device 100 includes a tube 110 and a nozzle 120. The tube 110 includes a first portion 110*a* and a second portion 110*b* connected to the first portion 110*a*, and the extending direction of the first portion 110*a* is different from the extending direction of the second portion 110*b*. That is to say, the extending direction of the first portion 110*a* intersects the extending direction of the second portion 110*b*. In the present embodiment, an extension axis AX of the second portion 110*b* of the tube 110 may be perpendicular to a top surface 320*s* of the micro element 320 (or defect 320D), but the disclosure is not limited thereto.

The nozzle 120 is connected to the end of the second portion 110*b* of the tube 110. More particularly, the nozzle 120 and the first portion 110*a* are respectively arranged at two opposite ends of the second portion 110*b*. In the present embodiment, the material of the nozzle 120 is the same as that of the tube 110. That is to say, the nozzle 120 and the tube 110 may be integrally formed, but the disclosure is not limited thereto. In other embodiments, one end of the tube 110 may also be sleeved with a sprayer, and one end of the sprayer far away from a sleeved position may be provided with the nozzle. For example, the sprayer is a plastic tip for a pipette.

On the other hand, the injection device 100 may also selectively include an base 130, and the first portion 110*a* of the tube 110 is connected to the base 130. For example, the base 130 may be connected to the carrier 101 in a sliding manner, and drives the tube 110 to move along the extending direction of the first portion 110*a*. Based on this, when the image capturing element 210 is scanning the object under test (the micro LED wafer) 300 for detecting defect position, the base 130 may bring the tube 110 to close the carrier 101, so as to make the tube 110 be outside the field of view of the image capturing element 210 (as shown in FIG. 3B). On the contrary, when the injection device 100 is actuated, the base 130 may bring the tube 110 to move toward the carrying stage 50 and to approach the defect 320D (as shown in FIG. 3C).

The micro light emitting diode inspection and repairing equipment 10 may also include a moving mechanism 240 and a control device 250. In the present embodiment, the injection device 100 and the image capturing element 210 are arranged on the same moving mechanism 240, and the moving mechanism 240 is adapted to drive the injection device 100 (or image capturing element 210) to move to the defect 320D (or the target position on the carrying stage 50 corresponding to the defect 320D) according to the position coordinate of the defect 320D. However, the disclosure is not limited thereto. According to other embodiments, the injection device 100 and the image capturing element 210 may also be respectively arranged on different moving mechanisms 240.

In the present embodiment, the control device 250, for example, is a microcontroller unit (MCU). For example, the control device 250 is configured to receive a setting instruction through a man-machine interface, and drives the optical inspection module 60, the injection device 100 and the moving mechanism 240 according to process parameters or real-time feedback. Namely, the control device 250 may integrate the functions of the image capturing element 210, the image processing device 220, the storage device 230 and the moving mechanism 240. The optical inspection and repairing method suitable for the micro light emitting diode inspection and repairing equipment 10 will be exemplarily illustrated below.

Referring to FIG. 2 and FIG. 3A, firstly, the micro light emitting diode inspection and repairing equipment 10 is provided (step S401), and the object under test 300 (for example, micro LED wafer) is placed on the carrying stage 50 of the micro light emitting diode inspection and repairing equipment 10 (step S402). For example, the object under test 300 may be transported onto the carrying stage 50 by using a mechanical arm. After the object under test 300 is stably placed on the carrying stage 50, the object under test 300 is subjected to optical inspection with the optical inspection module 60 to verify whether the object under test 300 has at least one defect 320D (step S403). If no defects 320D are detected, the object under test 300 may be treated in the post-process or be directly delivered to a client. On the contrary, if a defect 320D is detected, the corresponding position coordinate may be obtained by the optical inspection module 60 (step S404), as shown in FIG. 2 and FIG. 3B. It is appreciated that if multiple defects 320D are detected, all position coordinates of these defects 320D may be obtained.

Referring to FIG. 2, FIG. 3C and FIG. 3D, next, the injection device 100 is moved to the target position of the carrying stage 50 corresponding to the defect 320D according to the obtained position coordinate. At this moment, the extension axis AX of the second portion 110*b* of the tube 110 passes through the defect 320D. After the injection device 100 is positioned at the defect 320D, the injection device 100 is driven to inject the fluid FD from the nozzle 120 to remove the defect 320D from the object under test 300 (step S405). Accordingly, it may be ensured that the fluid FD passing through the nozzle 120 can efficiently blow to the defect 320 and improve the defect removal rate of the injection device 100, and then increase the repairing yield of the object under test 300. In the present embodiment, the fluid FD, for example, is compressed air, but the disclosure is not limited thereto. According to other embodiments, the fluid FD may also be volatile high-pressure liquid.

For example, the extension axis AX of the second portion 110b may pass through one side edge of the defect 320D, so that the defect 320D is caused to generate a rotation torque under the impact of the fluid FD, and leaves the substrate 310 in an overturning manner. That is to say, the extension axis AX of the second portion 110b does not intersect a part of surface of the defect 320D where the symmetrical axis SA passes through. The defect 320D presents mirror symmetry according to the symmetrical axis SA. However, the disclosure is not limited thereto. According to other embodiments, a positioning relationship between the extension axis AX of the second portion 110b and the defect 320D may also be adjusted according to the actual condition (for example, the construction and configuration of the micro element) of the object under test 300. In the present embodiment, the micro light emitting diode inspection and repairing equipment may also include a suction device 70. The suction device 70 is adapted to move to the defect 320D according to the position coordinate and configured to suck the defect 320D removed by the fluid FD from the substrate 310. Particularly, when the suction device 70 acts, an intake airflow may be generated, the defect 320D removed from the substrate 310 may enter a discharge pipe connected with the suction device 70 through drive of the intake airflow (as shown in FIG. 3D).

Specifically, in the present embodiment, the inspection and repairing method as shown in FIG. 2 (namely, a manner of inspection and then repairing) is adopted by the micro light emitting diode inspection and repairing equipment 10, but the disclosure is not limited thereto. According to other embodiments, the image capturing element 210 and the injection device 100 of the micro light emitting diode inspection and repairing equipment 10 are arranged on the same moving mechanism 240, so that the defect 320D may be immediately removed from the substrate 310 through the injection device 100. That is to say, the micro light emitting diode inspection and repairing equipment 10 may also operate in a manner that inspection and repairing are synchronous. Accordingly, the removal accuracy (or repairing yield) of the defect may be promoted, and then the overall yield of the post process is improved. After the removal step of the defect 320D is completed, another optical inspection (step S403) may be performed on the object under test 300 to verify whether the object under test 300 has another defect 320D. If a defect 320D still exists, the above step S405 and step S404 may be repeated.

Referring to FIG. 4A, an area occupied by the nozzle 120 of the injection device 100 has a width W1 (namely the aperture diameter of the nozzle 120) in a direction D1, and the micro element 320 has a width W2 in the direction D1. In the present embodiment, a ratio of the width W1 to the width W2 may be between 0.1 and 0.5. On the other hand, in a direction perpendicular to the direction D1, the micro element 320 has a height H, and a space S is formed between the nozzle 120 and the micro element 320. In the present embodiment, a ratio of the space S to the height H is larger than 0.2 and less than or equal to 2. If a distance from the nozzle 120 to the micro element 320D (defect) is too far (for example, the ratio of the space S to the height H is larger than 2), airflow easily influences an adjacent good micro element 320. If the distance from the nozzle 120 to the defect 320D is too close (for example, the ratio of the space S to the height H is less than or equal to 0.2), the defect 320D is not easily removed. For example, the aperture diameter (or width W1) of the nozzle 120 may be less than 50 μm. However, the disclosure is not limited thereto. According to other embodiments, the size and configuration of the nozzle 120 of the injection device 100 may also be regulated according to the size and distribution density of the micro element 320.

From another point of view, the flow velocity of the fluid (for example, a fluid FD1) may also be adjusted according to the size of the micro element (for example, the micro element 320). For example, as shown in FIG. 4A, the injection device 100 generates fluid FD1 substantially with a flow velocity $v_1$ to remove the defect 320D of the object under test 300. On the other hand, as shown in FIG. 4B, the injection device 100 generates fluid FD2 substantially with a flow velocity $v_2$ to remove the defect 320AD (namely, the micro element 320A) of the object under test 300, wherein the size of the defect 320AD is larger than that of the defect 320D, the flow velocity $v_2$ of the fluid FD2 may be larger than the flow velocity $v_1$ of the fluid FD1, so as to improve the removal success rate of the defect 320AD.

Figure 5:
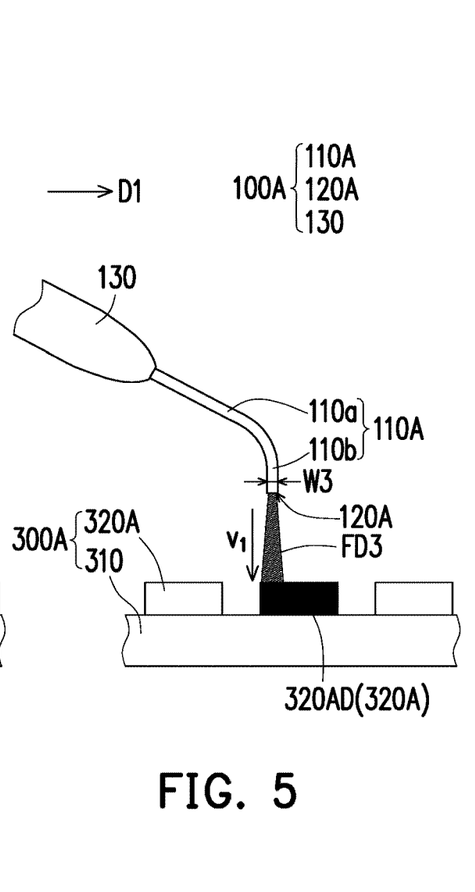
FIG. 5 is an operation diagram of an injection device according to another embodiment of the disclosure.

FIG. 5 is an operation diagram of an injection device according to another embodiment of the disclosure. Referring to FIG. 5, the injection device 100A of the present embodiment is different from the injection device 100A of FIG. 4A in that the sizes of the tube and the nozzle are different. In the present embodiment, a nozzle 120A of the injection device 100A has a width W3 in the direction D1, and the width W3 is larger than the width W1 of the nozzle 120 of FIG. 4A. The flow velocity $v_1$ of the fluid FD3 produced by the injection device 100A is enabled to have a flow velocity $v_1$ approximately same as that of the fluid FD1 of FIG. 4A, and the size of the defect 320AD (or micro element 320A) of the object under test 300A is larger than that of the defect 320D (or micro element 320) of the object under test 300 of FIG. 4A, the contact area of the fluid FD3 and the defect 320AD is increased through the enlargement of the width of the nozzle 120A, so that the defect 320AD generates enough rotation torque to be removed from the object under test 300A. On the other hand, in the present embodiment, the diameter of the tube 110A may essentially be equal to the width W3 of the nozzle 120A, but the disclosure is not limited thereto. In other embodiments, the diameter of the tube may also be smaller than the width of the nozzle.

Figure 6:
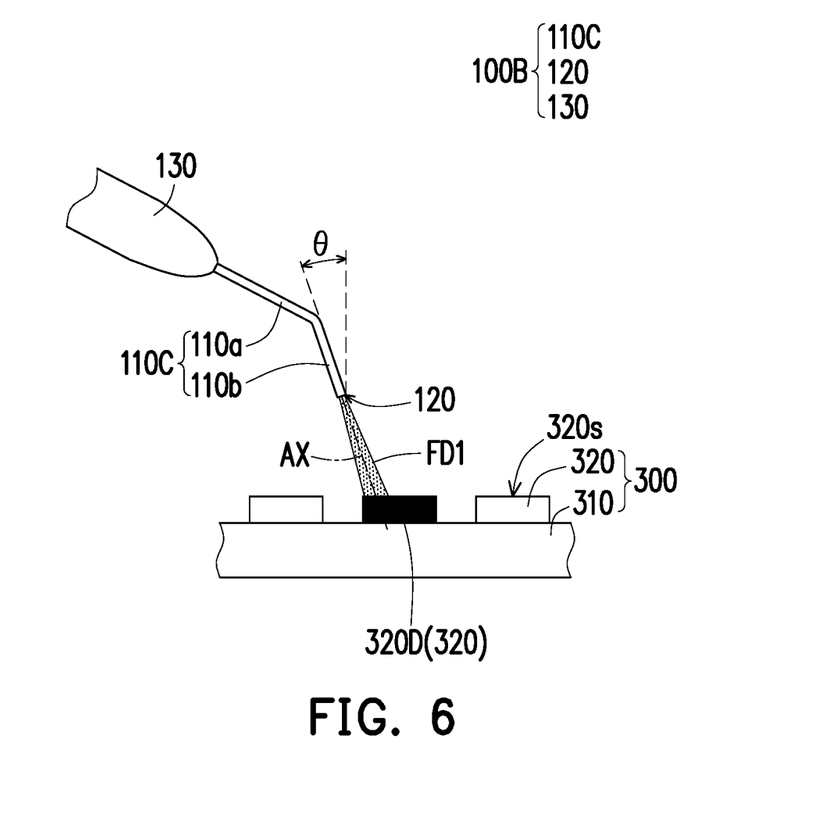
FIG. 6 is an operation diagram of an injection device according to still another embodiment of the disclosure.

FIG. 6 is an operation diagram of an injection device according to another embodiment of the disclosure. Referring to FIG. 6, the injection device 100B of the present embodiment is different from the injection device 100A of FIG. 4A in that the extension axis AX of the second portion 110b of a tube 110C of the present embodiment is inclined toward the top surface 320s of the micro element 320. That is to say, the extension axis AX of the second portion 110b is neither perpendicular nor parallel to the top surface 320s of the micro element 320. For example, an angle θ is included between the extension axis AX of the second portion 110b and the normal direction of the top surface 320s of the micro element 320, and the angle θ may be less than 90 degrees and greater than or equal to 10 degrees. More preferably, the angle θ may be less than 80 degrees and greater than 45 degrees. Accordingly, the removal success rate of the defect 320D by the injection device 100B may be improved, and the adjacent good micro element 320 may be ensured not to be unaffected in the removal process of the defect 320D, so as to increase the removal accuracy of the defect 320D, thereby improving the repairing yield of the object under test 300.

Figure 7:
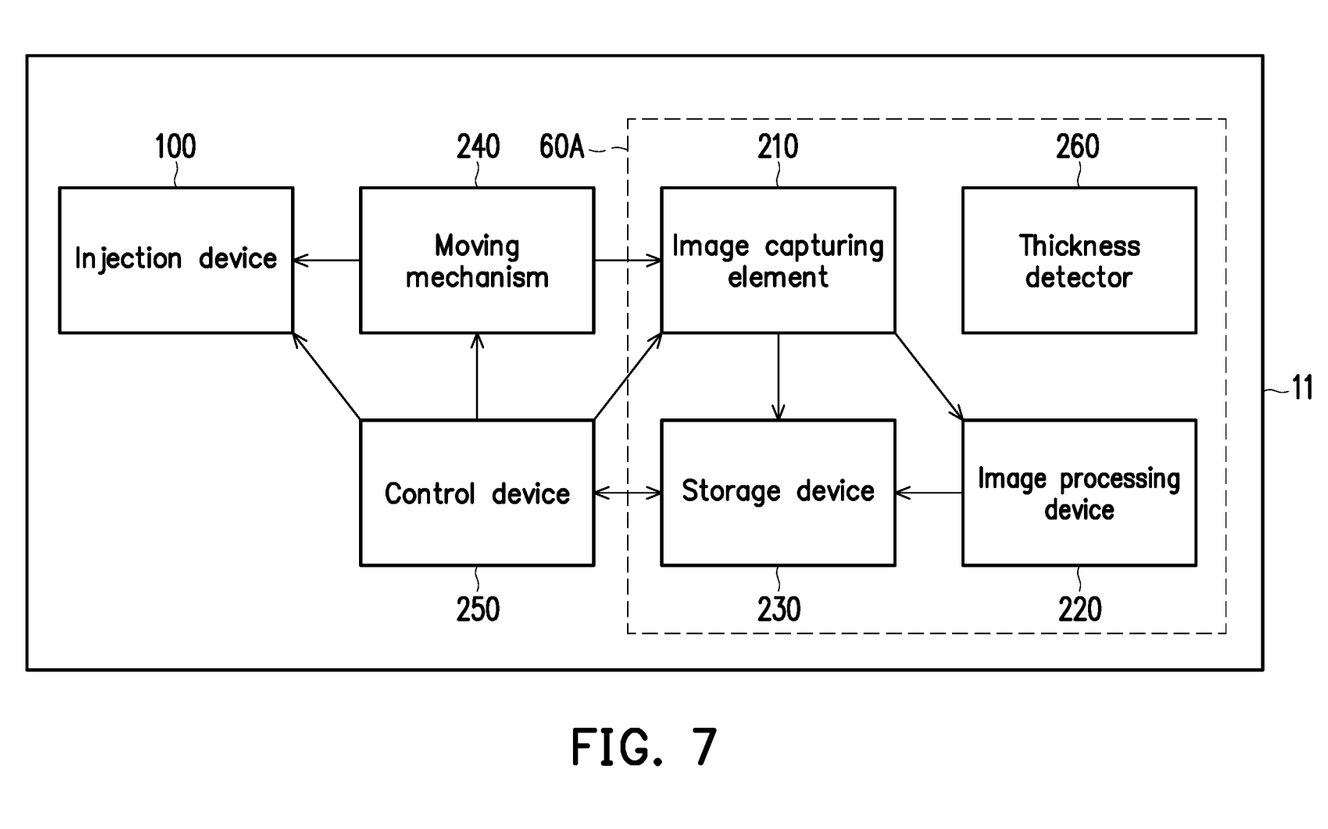
FIG. 7 is a block diagram of micro light emitting diode inspection and repairing equipment according to another embodiment of the disclosure.

FIG. 7 is a block diagram of micro light emitting diode inspection and repairing equipment according to another embodiment of the disclosure. Referring to FIG. 7, the micro light emitting diode inspection and repairing equipment 11 of the present embodiment is different from the micro light emitting diode inspection and repairing equipment 10 of FIG. 1 in that the compositions of the optical inspection modules are different. In the present embodiment, the optical inspection module 60A may also include a thickness detector 260. Here, the thickness detector 260, for example, is a white light interferometer, may be used to obtain the thickness information of the object under test at the target position of the carrying stage, or even thickness distribution information (for example, film thickness uniformity or surface roughness) of the object under test in a target area.

In summary, in the micro light emitting diode inspection and repairing equipment and method according to an embodiment of the disclosure, the optical inspection module is used to carry out the optical inspection of the object under test to obtain the position coordinate of the defect, which helps to ensure the positioning relationship between the injection device and the defect, thereby improving the removal accuracy of the defect. On the other hand, the extension axis of the second portion of the tube passes through the defect, so that the fluid passing through the nozzle can efficiently blow to the defect to remove the defect from the substrate of the object under test. In this way, it helps to improve the overall yield of the post process.

Although the disclosure is described with reference to the above embodiments, the embodiments are not intended to limit the disclosure. A person of ordinary skill in the art may make variations and modifications without departing from the spirit and scope of the disclosure. Therefore, the protection scope of the disclosure should be subject to the appended claims.

What is claimed is:

1. A micro light emitting diode inspection and repairing equipment, comprising:
    a carrying stage;
    an optical inspection module arranged corresponding to the carrying stage so as to capture image information and obtain a position coordinate from the image information; and
    an injection device adapted to move to a target position of the carrying stage according to the position coordinate, the injection device comprising:
        a tube comprising a first portion and a second portion connected to the first portion, wherein an extending direction of the first portion is different from an extending direction of the second portion, and an extension axis of the second portion passes through the target position; and
        a nozzle connected to the second portion of the tube, wherein a fluid blows to the target position after passing through the tube and the nozzle.

2. The micro light emitting diode inspection and repairing equipment according to claim 1, further comprising:
    a suction device arranged on the carrying stage and adapted to move to the target position according to the position coordinate.

3. The micro light emitting diode inspection and repairing equipment according to claim 1, wherein the optical inspection module comprises:
    an image capturing element configured to capture the image information; and
    an image processing device coupled to the image capturing element and configured to analyze the image information to obtain the position coordinate.

4. The micro light emitting diode inspection and repairing equipment according to claim 3, further comprising at least one moving mechanism, wherein the image capturing element and the injection device are arranged on the moving mechanism, and the moving mechanism is adapted to drive the image capturing element and the injection device to move relative to the carrying stage.

5. The micro light emitting diode inspection and repairing equipment according to claim 3, wherein the image capturing element comprises:
    a lens module; and
    an image sensor coupled to the image processing device, wherein the lens module is located between the carrying stage and the image sensor.

6. The micro light emitting diode inspection and repairing equipment according to claim 1, wherein the optical inspection module comprises a thickness detector configured to measure height information of the target position of the carrying stage.

7. The micro light emitting diode inspection and repairing equipment according to claim 1, wherein the nozzle and the tube are integrally formed.

* * * * *